US012713653B2

(12) United States Patent
Cheng et al.

(10) Patent No.: US 12,713,653 B2
(45) Date of Patent: Aug. 18, 2026

(54) SQUARE-SHAPED CONTACT WITH IMPROVED ELECTRICAL CONDUCTIVITY

(71) Applicant: International Business Machines Corporation, Armonk, NY (US)

(72) Inventors: Kangguo Cheng, Schenectady, NY (US); Ruilong Xie, Niskayuna, NY (US); Julien Frougier, Albany, NY (US); Min Gyu Sung, Latham, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 537 days.

(21) Appl. No.: 17/806,514

(22) Filed: Jun. 13, 2022

(65) Prior Publication Data

US 2023/0402514 A1 Dec. 14, 2023

(51) Int. Cl.
*H10D 30/67* (2025.01)
*H10D 62/10* (2025.01)

(52) U.S. Cl.
CPC ..... *H10D 30/6729* (2025.01); *H10D 30/6735* (2025.01); *H10D 62/118* (2025.01)

(58) Field of Classification Search
CPC ........... H10D 30/6729; H10D 30/6735; H10D 62/118; H10D 30/014; H10D 30/0198; H10D 30/6757; H10D 62/121; H10D 64/251; H10D 84/0149; H10D 30/43–435; H10D 62/119–123; H01L 21/76831; H01L 21/76897; H01L 23/5286; H01L 23/481; B82Y 10/00; H10W 20/069; H10W 20/481; H10W 20/076; H10W 20/427
See application file for complete search history.

(56) References Cited

U.S. PATENT DOCUMENTS

| | | | |
|---|---|---|---|
| 7,111,518 | B1 | 9/2006 | Allen |
| 8,093,729 | B2 | 1/2012 | Trezza |
| 10,586,765 | B2 | 3/2020 | Smith |
| 10,636,739 | B2 | 4/2020 | Beyne |
| 10,797,139 | B2 | 10/2020 | Morrow |

(Continued)

FOREIGN PATENT DOCUMENTS

| | | | |
|---|---|---|---|
| EP | 3324436 | B1 | 8/2020 |
| WO | 2013020867 | W | 2/2013 |

*Primary Examiner* — Shahed Ahmed
(74) *Attorney, Agent, or Firm* — Edward J. Wixted, III

(57) ABSTRACT

An approach provides a semiconductor structure with one or more rectangular or square-shaped contact vias in a semiconductor material. The semiconductor device includes one of the first element of the semiconductor device element under the square-shaped contact via or the second element of the semiconductor device element above the square-shaped contact via. The semiconductor structure includes the square-shaped via in the semiconductor material that has straight edges that are parallel to one or more of the (110) crystal planes of the semiconductor material and the square-shaped contact vias has corners pointing in a direction orthogonal to one or more of the (100) crystal planes of the semiconductor material. The square-shaped contact via provides a larger contact area that a conventional round-shaped contact via with a diameter matching the width of the square-shaped contact via.

17 Claims, 14 Drawing Sheets

View X-X

(56) References Cited

U.S. PATENT DOCUMENTS

| | | | | |
|---|---|---|---|---|
| 10,833,089 | B2 | 11/2020 | Pille | |
| 10,892,215 | B2 | 1/2021 | Nelson | |
| 10,985,064 | B2 | 4/2021 | Zhang | |
| 11,257,764 | B2 | 2/2022 | Hiblot | |
| 2018/0218973 | A1 | 8/2018 | Nelson | |
| 2019/0164882 | A1 | 5/2019 | Chen | |
| 2020/0105671 | A1 | 4/2020 | Lai | |
| 2020/0266169 | A1 | 8/2020 | Kang | |
| 2020/0373242 | A1 | 11/2020 | Hiblot | |
| 2021/0104435 | A1 | 4/2021 | Son | |
| 2021/0111115 | A1 | 4/2021 | Patrick | |
| 2021/0118798 | A1 | 4/2021 | Liebmann | |
| 2021/0134721 | A1 | 5/2021 | Chiang | |
| 2021/0202385 | A1 | 7/2021 | Huang | |
| 2021/0202472 | A1 | 7/2021 | Thomson | |
| 2021/0358848 | A1 | 11/2021 | Wu | |
| 2021/0375861 | A1* | 12/2021 | Chung | H10D 84/038 |
| 2022/0020738 | A1* | 1/2022 | Lai | H01L 23/5226 |
| 2023/0260825 | A1* | 8/2023 | Ren | H10D 30/501<br>438/197 |
| 2023/0268344 | A1* | 8/2023 | Huang | H10D 30/43<br>257/288 |
| 2023/0387316 | A1* | 11/2023 | Liang | H10D 64/256 |

* cited by examiner

View X-X

900

Contact via hole

71

View X-X

SQUARE-SHAPED CONTACT WITH IMPROVED ELECTRICAL CONDUCTIVITY

BACKGROUND OF THE INVENTION

The present invention relates generally to the field of semiconductor device formation and particularly to the formation of contacts in semiconductor devices and more particularly to forming squared-shaped contacts in a layer of semiconductor material using a wet ammonia etching process.

Semiconductor device fabrication is a series of processes used to create integrated circuits present in electronic devices such as computers. As device scaling continues to shrink, in accordance with Moore's Law, electrical performance requirements continue to be more important in semiconductor devices. With smaller and smaller feature sizes, the connections and contacts between the semiconductor features also face size reductions and decreased space between contacts and connections.

SUMMARY

Embodiments of the present invention provide a semiconductor structure with one or more rectangular-shaped contact vias in a semiconductor material where a first element of the semiconductor device is under the square-shaped contact via and a second element of the semiconductor device is above the square-shaped contact via. Embodiments of the present invention provide the square-shaped via in the semiconductor material that has straight edges that are parallel to one or more (110) crystal planes of the semiconductor material and the square-shaped contact vias has corners pointing in a direction orthogonal to one or more of (100) crystal planes of the semiconductor material. The square-shaped contact via provides a larger contact area that a conventional round-shaped contact via with a diameter matching the width of the square-shaped contact via.

Embodiments of the present invention provide a method of forming a rectangular-shaped contact via in a semiconductor material. The method includes patterning a top surface of a first layer of dielectric material on a semiconductor material for a first contact via hole and etching a round contact via hole through the layer of dielectric material and through a semiconductor layer using a conventional via hole etching process. The method includes adding a wet ammonia etching process, where performing the wet ammonia etching process on the round contact via hole transforms the round contact via hole to a rectangular-shaped contact via hole. The method includes removing the first layer of dielectric material on the semiconductor material and removing a portion of a second layer of dielectric material that is over a source/drain of the semiconductor device. The method includes depositing a layer of a contact material over the semiconductor material and in the rectangular-shaped contact via hole. The method includes depositing and planarizing the layer of the contact metal to form the rectangular-shaped contact via.

BRIEF DESCRIPTION OF THE DRAWINGS

The above aspects, other aspects, features, and advantages of various embodiments of the present invention will be more apparent from the following description taken in conjunction with the accompanying drawings.

Figures 11, 12:
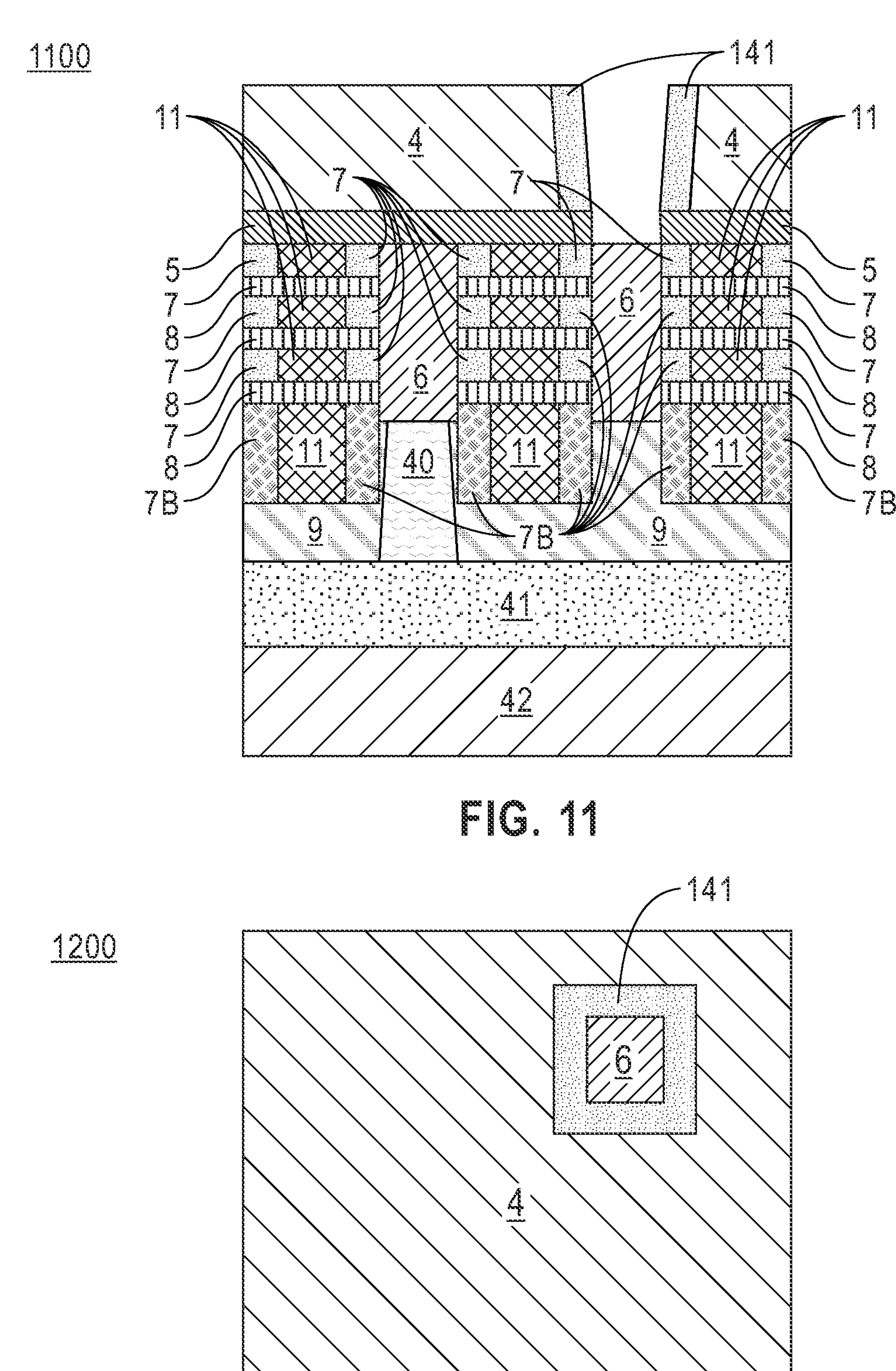
FIG. 11 depicts a cross-sectional view of the semiconductor structure through X-X after removing the dielectric cap layer and depositing a liner material, in accordance with an embodiment of the present invention.
FIG. 12 depicts a top view of the semiconductor structure depicted in FIG. 11, in accordance with an embodiment of the present invention.

a top view of the semiconductor structure of FIG. 12 through the dielectric cap layer, the semiconductor substrate, and the bottom dielectric isolation after the wet etch process with the ammonia-containing etchant, in accordance with an embodiment of the present invention.

Figure 14:
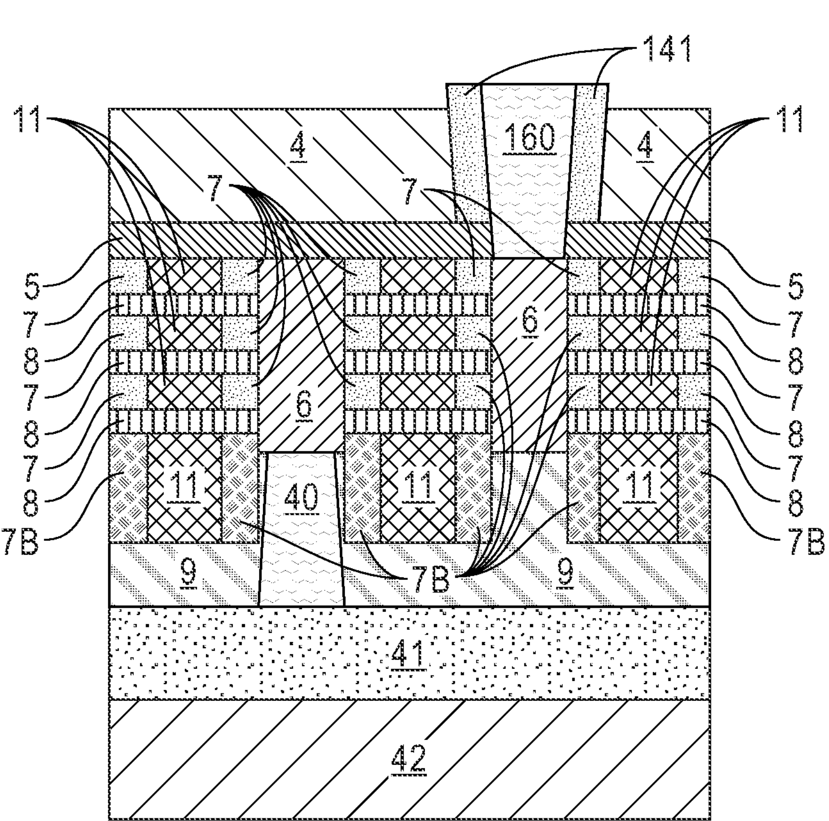

FIG. 14 depicts a cross-sectional view through X-X of the semiconductor structure after recessing the semiconductor layer, in accordance with an embodiment of the present invention.

Figure 15:
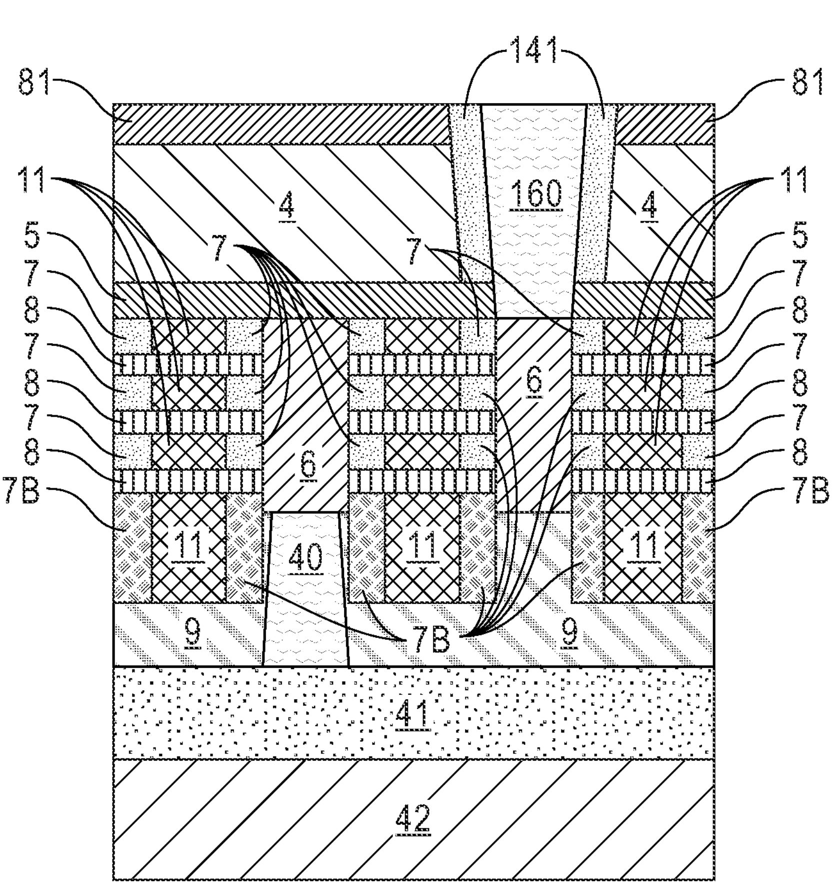

FIG. 15 depicts a cross-sectional view through X-X of the semiconductor structure after a depositing dielectric cap material, in accordance with an embodiment of the present invention. after removing the horizontal portion of the layer of the spacer material, in accordance with an embodiment of the present invention.

Figure 16:
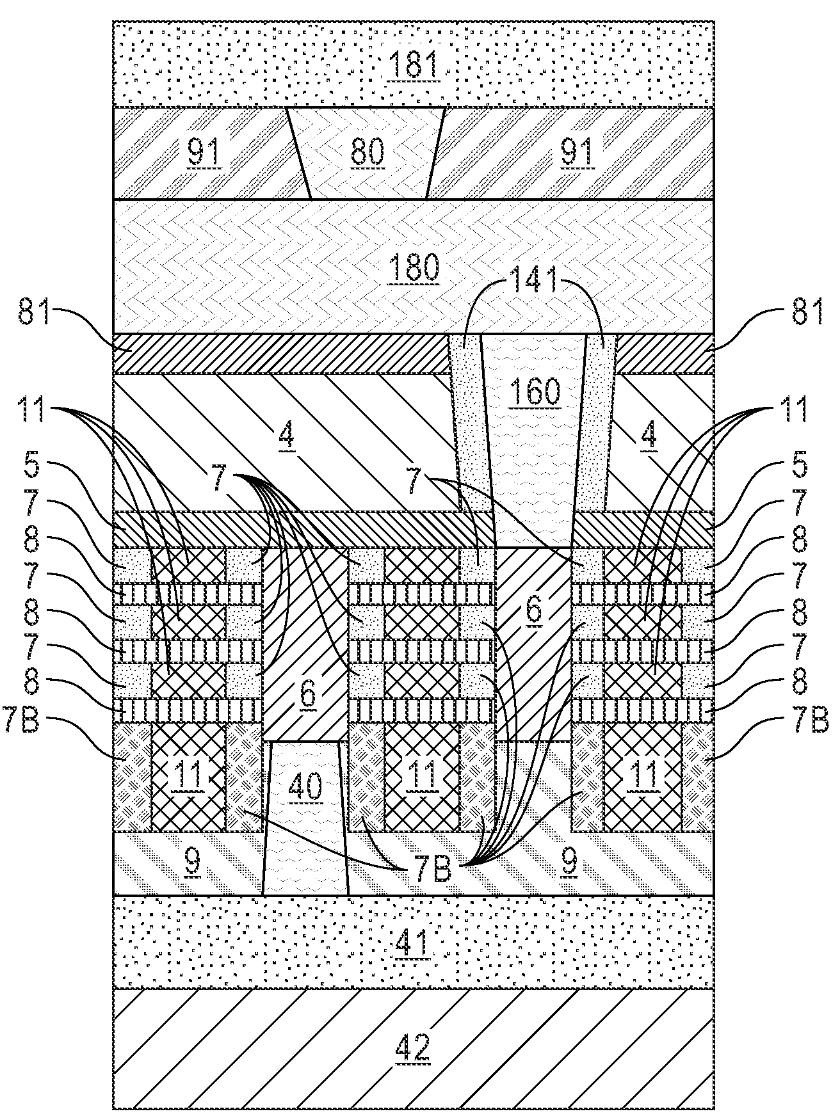

FIG. 16 depicts a cross-sectional view through X-X of the semiconductor structure after forming a backside power rail and a backside power delivery network (BSPDN), in accordance with an embodiment of the present invention.

Figure 17:
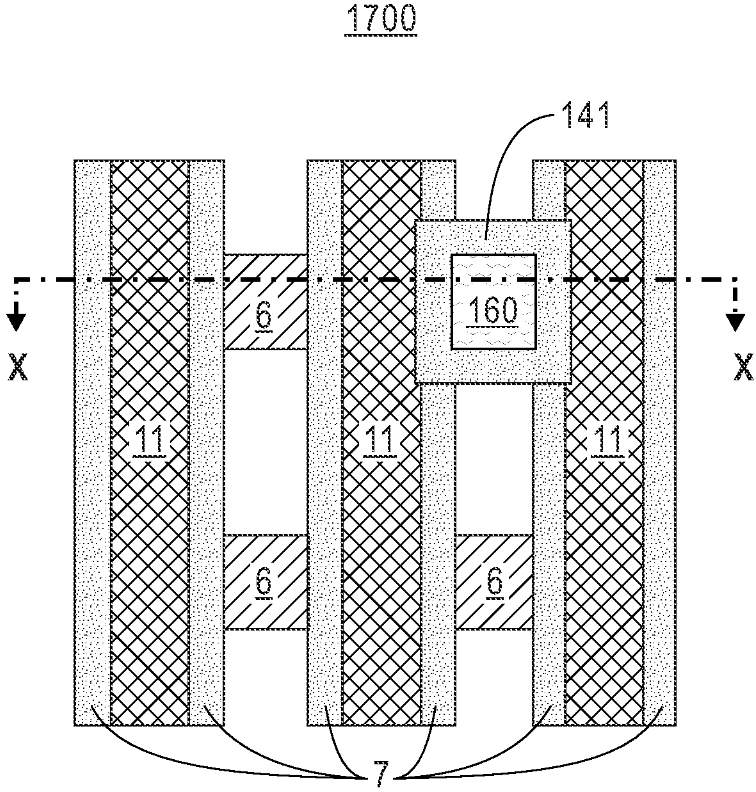

FIG. 17 depicts a view from the backside of the nanosheet transistor of the semiconductor structure of FIG. 16, in accordance with an embodiment of the present invention.

DETAILED DESCRIPTION

Embodiments of the present invention recognize that conventional methods of forming contact vias or contacts using standard lithography and etching processes results in a contact via with an oval or round shape even when patterned for a square shape in design. As known in the art, during the lithography and etching processes, the loss of sharp corners occurs resulting in a contact via hole with rounded corners. Embodiments of the present invention recognize that round contact vias may not contact all of the exposed surfaces of the source/drain epi during semiconductor device formation. Embodiments of the present invention recognize that forming contact vias or contacts with a square or rectangular shape that contact all of the exposed surfaces of the source/drain would be desirable.

Embodiments of the present invention provide a semiconductor structure with a rectangular or square-shaped contact via or square-shaped contact in a semiconductor layer of a flipped wafer semiconductor structure. Embodiments of the present invention provide the square-shaped contact via where the bottom surface of the square-shaped contact via connects to the top surface of the semiconductor device source/drain and the top surface of the square-shaped contact via contacts the bottom surface of a backside power rail in the semiconductor structure. Compared to conventional round-shaped contact vias, the square-shaped contact vias increase the contact area of the contact via and thereby improve the performance of the resulting semiconductor device. Changing the shape of a conventional contact from a circular or oval shape to the disclosed rectangular or a square-shaped contact with a larger contact area contacting surfaces of the semiconductor elements above and below the contact improves the performance of the resulting semiconductor devices.

Embodiments of the present provide a rectangular or square-shaped contact via contacting a backside power rail and a source/drain. The rectangular-shaped contact via reduces the electrical contact resistance of the rectangular-shaped contact via with both the source/drain and the backside power rail as compared to the electrical resistance of a similar sized conventional round contact via. Furthermore, embodiments of the present invention provide a method of forming rectangular-shaped vias that may be formed between any elements capable of being connected by vias in a semiconductor material in a semiconductor device or other electronic device with elements that are connected by a via in a layer of a semiconductor material with appropriately oriented crystal planes.

Embodiments of the present invention transform a conventionally formed round or oval-shaped contact via hole into a square-shaped contact via hole by adding a wet ammonia etching process after a conventional, directional contact via hole etch process. The addition of the wet ammonia etching process selectively and rapidly etches the sides of the round contact via hole in the (100) crystal plane of a semiconductor substrate (e.g., silicon) while not etching the portions of the semiconductor substrate in the (110) crystal planes. With the (100) crystal planes oriented approximately forty-five degrees to the (100) crystal planes, the rapid etch of the round contact via hole in the semiconductor layer in the direction of the (100) crystal planes occurs with minimal to no etching of the contact via hole in the direction of the (110) crystal planes. In this way, the round-shaped contact via hole changes into a square-shaped contact via hole. Embodiments of the present invention create the square-shaped contact via after the conventional round-shaped contact via hole is etched using an ammonia containing etchant and then, the square-contact contact via hole is filled with a contact metal and planarized. Embodiments of the present invention provide a semiconductor structure with square-shaped contact vias that improve the electrical performance of the completed semiconductor chip when compared to a similar sized conventional round contact via. Embodiments of the present invention provide a square-shaped contact via for a logic or a memory semiconductor device.

Embodiments of the present invention provide improved thermal performance for the semiconductor device by providing a layer of semiconductor material with a thin layer of dielectric material that separates the semiconductor device from the backside power rail. The layer of semiconductor material provides a better thermal conductivity than the typical dielectric layer above the semiconductor device. A conventional semiconductor structure typically uses a dielectric material that has a lower thermal conductivity than a semiconductor material to separate the semiconductor device from the backside power rail. The layer of the semiconductor material above the semiconductor device improves the thermal dissipation of any heat generated by the semiconductor device. Additionally, the square-shaped contact vias with increased contact area with the semiconductor source/drain and the backside power rail compared to a similar size, conventional, round contact via also provides a slight improvement in thermal conductivity of the completed semiconductor chip.

Embodiments of the present invention disclose a method of forming the square-shaped via that can be used to form any type of electronic device using a semiconductor layer with suitably oriented crystal planes between electrical elements to be connected by the square-shaped via. The method includes introducing an ammonia-containing wet etching process to a round or oval-shaped contact via hole where the (100) crystal planes are parallel to the contact via hole which etches the semiconductor material rapidly in the direction of the (100) crystal planes. The ammonia-containing wet etching process etches the (110) crystal planes slowly and is essentially self-limiting in the (110) crystal planes. With this method, after adding a wet ammonia etch to a round-shaped contact via hole in a layer of silicon semiconductor material creates the square-shaped contact via hole which, with conventional via hole fill and planarization forms the square-shaped contact via. The method and processes to form the square-shaped contact via holes are not limited to nanosheet transistors or to contact vias but embodiments of the present invention form other types of semiconductor devices and other types of holes such as via holes used to form heater elements in a phase-change memory device.

The method disclosed in embodiments of the present invention includes forming a transistor with known nanosheet stack semiconductor processes on a semiconductor substrate with a etch stop layer and a layer of a semiconductor material respectively above the semiconductor substrate. Other embodiments of the present invention include forming a memory device with known methods of memory device formation including but not limited to magnetoresistive random-access device formation methods or phase-change memory device formation methods. The method disclosed in embodiments of the present invention can be applied to other types of devices, such as photovoltaic devices, with vias connecting elements on either side of a layer of a suitable semiconductor material.

Figure 1A:
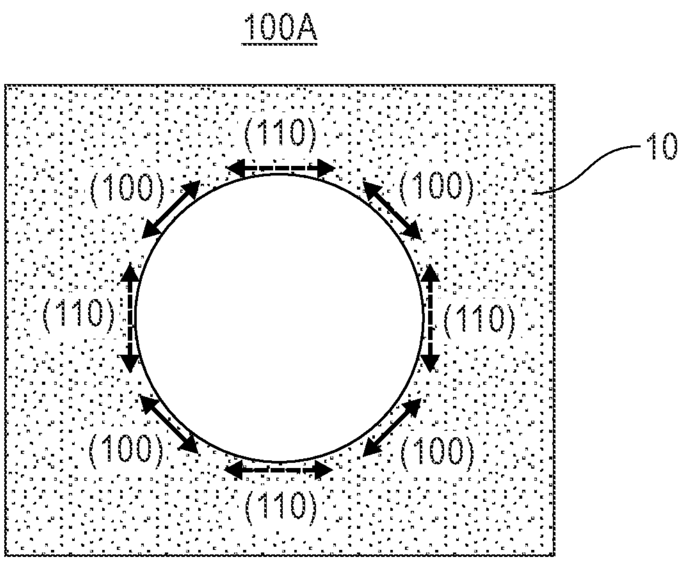
FIG. 1A depicts a top view of a semiconductor substrate with a square-shaped hole, in accordance with an embodiment of the present invention.
Figure 10:
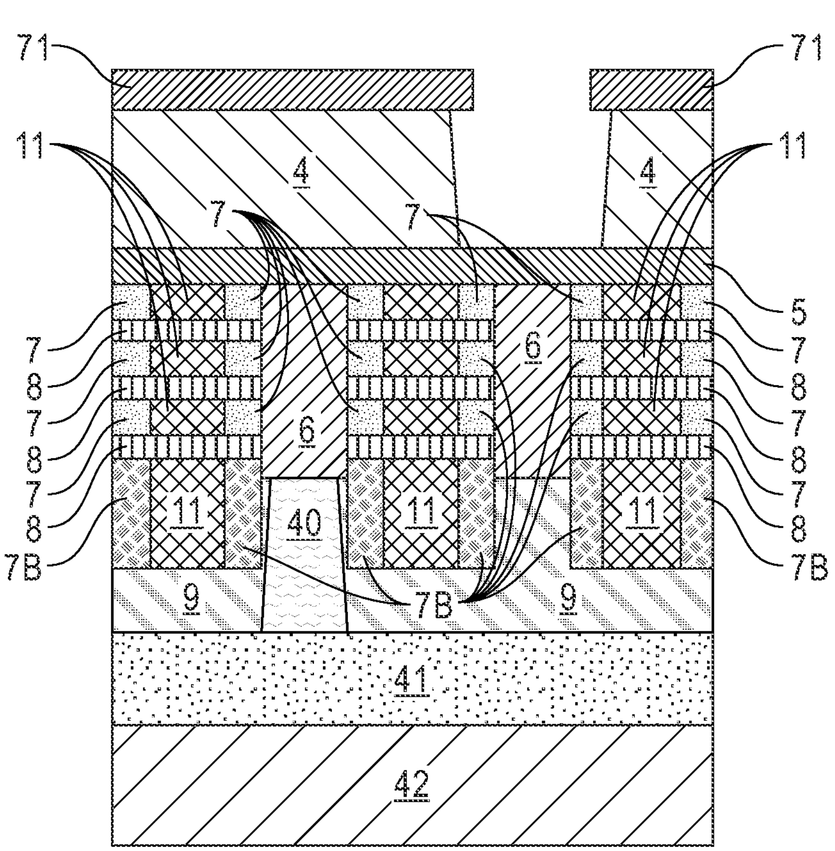
FIG. 10 depicts a cross-sectional view through X-X of the semiconductor structure after performing a wet ammonia etching process to form square-shaped contact via holes, in accordance with an embodiment of the present invention.

The method includes forming back-end of the line (BEOL) interconnect wiring above a layer of interlayer dielectric deposited on the semiconductor device and bonding a carrier wafer to the BEOL interconnect wiring. The method includes flipping the bonded wafer so that the semiconductor substrate is exposed on the top surface and then, using backside wafer grinding to remove the semiconductor substrate. One or more wet etching processes can remove the etch stop layer exposing the semiconductor layer and then, depositing a dielectric cap material. Using conventional lithography for patterning and an isotropic etching process (i.e., reactive ion etch) a round or oval-shaped contact via hole is formed. Using a wet etching process with an ammonia-containing etchant, the (100) crystal planes rapidly etch, and the (110) crystal planes of a semiconductor material, such as silicon, in the semiconductor layer are etched or etch very slowly etch resulting in a square-shaped contact via hole above the source/drain of the semiconductor device when the (100) crystal planes and (110) crystal planes are parallel the round-shaped contact via hole and as depicted in FIGS. 1A and 10.

The method includes filling the square-shaped contact via hole and depositing a layer of spacer material over the semiconductor structure followed by an isotropic etch removing the spacer material from the horizontal surfaces. Using conventional processes, a backside power rial is deposited on the dielectric cap and one or more vias are formed in an interlayer dielectric material on the dielectric cap. Using conventional processes, a backside power delivery network is formed over the interlayer dielectric and the via.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings but are merely used to enable a clear and consistent understanding of the invention. Hereinafter, the terms "contact via" and "contact" may be used interchangeably. A contact in a semiconductor chip, typically, connects a transistor or other semiconductor device to a next metal layer or another semiconductor device element. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layers at the interface of the two elements.

In the interest of not obscuring the presentation of embodiments of the present invention, in the following detailed description, some processing steps or operations that are known in the art may have been combined for presentation and illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication, and are not drawn to scale, but instead are drawn to illustrate the features of the described embodiments. For the purposed of the present invention, the terms "nanosheet stack" and "nanosheet stack" are interchangeable. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described. It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes as used herein include but are not limited to ionized plasma vapor deposition (iPVD), plasma vapor deposition (PVD), electroplating atomic layer deposition (ALD), plasma-enhanced chemical vapor deposition (PECVD), CVD, gas cluster ion beam (GCIB) deposition, ionized plasma vapor deposition (iPVD), PVD, or electroplating.

Selectively etching as used herein includes but is not limited to patterning using one of lithography, photolithography, an extreme ultraviolet (EUV) lithography process, or any other known semiconductor patterning process followed by one or more the etching processes. Some examples of etching processes include but are not limited to the following processes, such as a dry etching process using a reactive ion etch (RIE) or ion beam etch (IBE), a wet chemical etch process, or a combination of these etching processes. A dry etch may be performed using a plasma. Ion milling, sputter etching, or reactive ion etching (ME) bombards the wafer with energetic ions of noble gases that approach the wafer approximately from one direction, and therefore, these processes are an isotropic or directional etching processes.

Reference is now made to the figures. The figures provide a schematic cross-sectional illustration of semiconductor devices at intermediate stages of fabrication, according to one or more embodiments of the invention. The figures provide schematic representations of the devices of the invention and are not to be considered accurate or limiting with regards to device element scale.

FIG. 1A depicts a top view 100 of semiconductor substrate 10 with a round-shaped hole, in accordance with an embodiment of the present invention. As depicted, FIG. 1A illustrates semiconductor substrate 10 with (110) crystal planes of the semiconductor material depicted with dashed arrows extending horizontally to the left and right directions and vertically up and down in FIG. 1A. FIG. 1A also includes solid arrows extending at approximately a 45-degree angle to the horizontal edges of the drawing paper, illustrating the (100) crystal planes of the semiconductor substrate 10. As depicted in FIG. 1A, the solid arrows extending in diagonal directions are approximately 45 degrees to the dashed arrows indicating the (110) crystal planes of semiconductor substrate 10. As known to one skilled in the art, Miller indices provide a group of three numbers that indicate the orientation of a plane or a set of parallel planes of atoms in a crystal. The (110) crystal planes and the (100) crystal planes extend vertically parallel to the vertical sides of the hole in semiconductor substrate 10.

Semiconductor substrate 10, for example, can be a silicon wafer but is not limited to this material. In various embodiments, semiconductor substrate 10 can be the same semiconductor material as semiconductor 4 depicted in FIG. 3. The crystal plane directions illustrated in FIG. 1A can be the same as the crystal plane directions of semiconductor 4 depicted in FIG. 3. The opening or hole in semiconductor substrate 10 can be a via hole such as a contact via hole formed using conventional via hole processes (e.g., lithography and RIE). As previously discussed, for the purposes of the present invention, the terms "contact via" and "contact" are interchangeable.

Figure 1B:
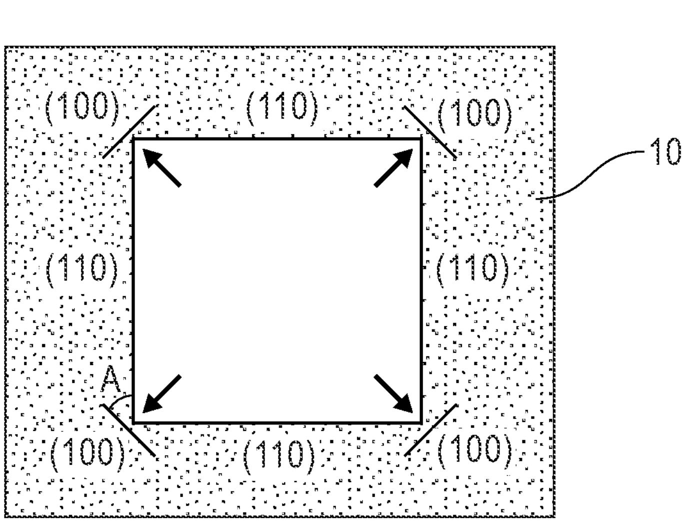
FIG. 1B depicts a top view of the semiconductor substrate with the square-shaped hole after a wet etching process selectively etches the semiconductor substrate in the (100) direction, in accordance with an embodiment of the present invention.

FIG. 1B depicts a top view 100B of semiconductor substrate 10 with the square-shaped hole after a wet ammonia etch of the hole or via hole in semiconductor structure 100A depicted in FIG. 1A, in accordance with an embodiment of the present invention. As depicted, FIG. 1B includes an illustration of the orientation of the (100) and the (110) crystal planes in semiconductor substrate 10 and angle A between the (100) crystal planes and the (110) crystal planes. As depicted in FIG. 1B, angle A is approximately 45 degrees. In various embodiments, the orientations of the (100) and the (110) crystal planes are the same as the orientation of the (100) and the (110) crystal planes of semiconductor 4 in FIGS. 3-17 discussed later.

FIG. 1B depicts semiconductor substrate 10 after etching the round hole depicted in FIG. 1A with an ammonia-containing etchant that preferentially etches the (100) crystal planes directly adjacent to the round hole in semiconductor substrate 10 depicted in FIG. 1A. The arrows pointing to the corners of the square-shaped via hole in FIG. 1B indicate the direction of the rapid etching in the direction of the (100) crystal planes of semiconductor substrate 10. The horizontal and the vertical edges of the square-shaped via hole that are labelled (110) indicate the (110) crystal planes etch very slowly. As previously stated, the etching of semiconductor substrate 10 in the direction of the (110) is self-limiting and virtually stops on the (110) crystal planes of the round-shaped hole.

The rapid outward etching of the (100) planes with little to no etching of the (110) crystal planes transforms the round-shaped via hole of FIG. 1A to the square-shaped via hole depicted in FIG. 1B. After the wet ammonia etching of round-shaped via holes, the (110) crystal planes are parallel to the straight edges (e.g., the horizontal and vertical edges of the square-shaped or rectangular-shaped hole in FIG. 1B) and the (100) crystal planes are parallel to the diagonal direction that is approximately 45 degrees from the horizontal or vertical sides. The diagonal direction in the contact via hole depicted in FIG. 1B would be a direction extending from one corner of the square-shaped hole to the opposite corner. In other words, the diagonal direction would be parallel to the arrows in the corners of the square-shaped contact via hole where rapid etching occurs in the direction of the (100) crystal planes to change the round-shaped hole to a square-shaped hole.

As depicted in FIG. 1B, the corners of the square-shaped hole (e.g., as indicated by the arrows) point in a direction orthogonal or 90 degrees to the (100) crystal planes of semiconductor substrate 10. The rapid etching of semiconductor substrate 10 moves in the direction of or towards the next of the (100) crystal planes. As commonly known, in geometry, a square is also a rectangle (i.e., the square-shape is a subset of a rectangular shape).

In other examples, other etchants and/or another semiconductor material may exhibit similar etching properties (i.e., a slow to no etch of some crystal planes and a rapid etching of other semiconductor crystal planes oriented about 45 degrees or diagonal to the slowly etching crystal planes) that can transform a conventionally formed round hole in the semiconductor material into a square-shaped hole.

Figure 2:
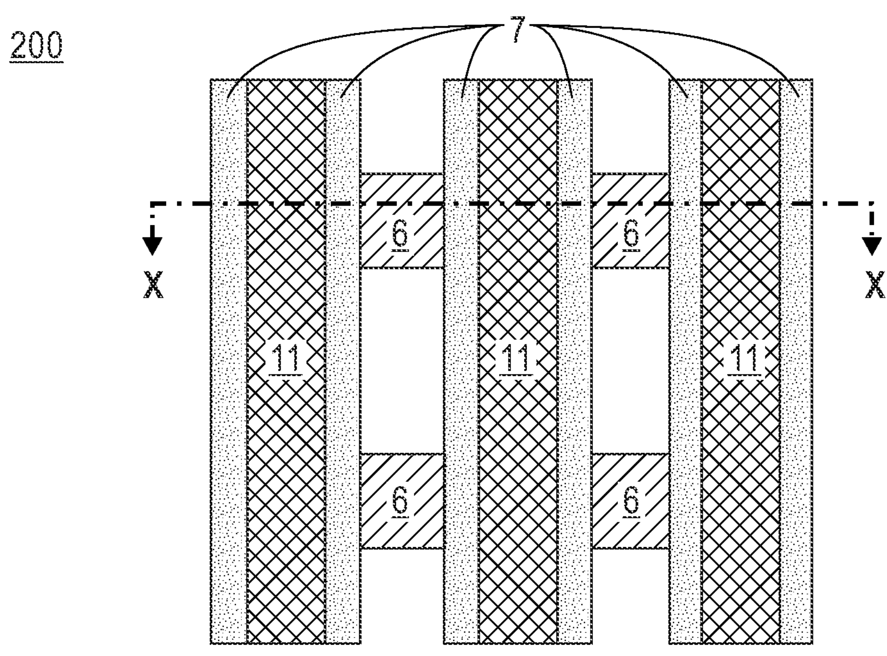
FIG. 2 depicts a view of a bottom of a nanosheet transistor looking through the backside of the semiconductor substrate and bottom dielectric isolation layer, in accordance with an embodiment of the present invention.

FIG. 2 depicts a view of a bottom of a nanosheet transistor looking through the backside of the semiconductor substrate and bottom dielectric isolation layer, in accordance with an embodiment of the present invention. As depicted, FIG. 2 includes a portion of gate 11, inner spacers 7, and source/drain (S/D) 6 as viewed upward through the bottom of dielectric isolation (BDI) layer 5 depicted later in FIG. 3. As depicted in FIG. 2, the shape of exposed portion of the bottom surface of S/D 6 between gates 11 can be a square or a rectangle when looking through BDI 5, semiconductor 4, and substrate 2 in semiconductor structure 300 in FIG. 3. The exposed square portion of S/D 6 is the area that a contact via such as backside contact 160 depicted in FIG. 16 contacts. A conventional, round-shaped contact via would not cover as much area of the bottom surface of S/D 6 as the square-shaped backside contact via 160 depicted in FIG. 16.

Also depicted in FIG. 2 is a location of cross-sections X-X. The location of cross-section X-X will the same in each of the semiconductor structures depicted in FIGS. 3-17 unless otherwise indicated.

Figure 3:
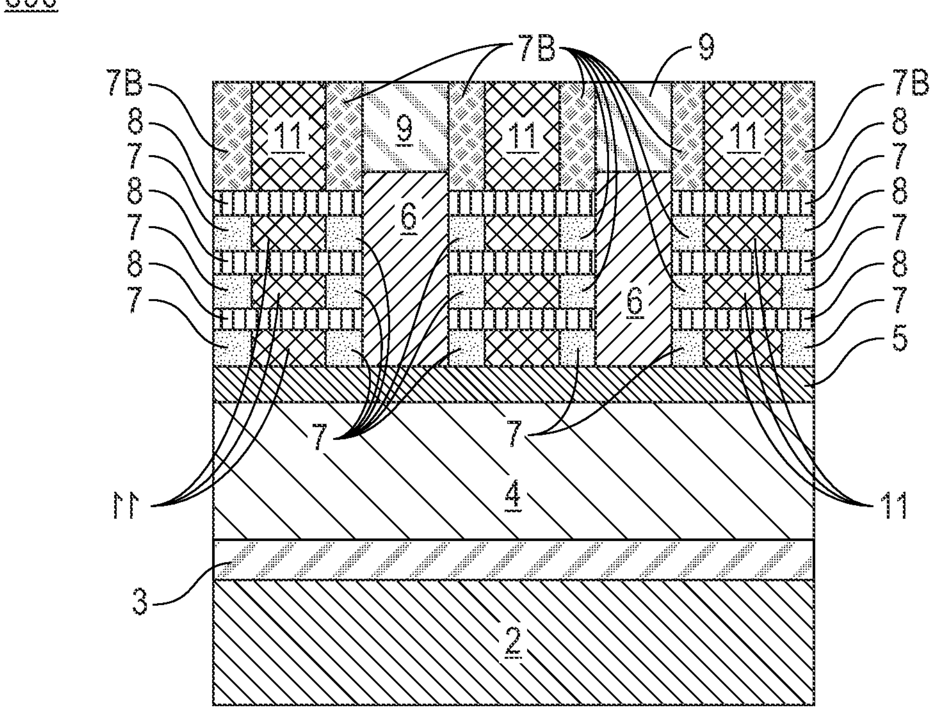
FIG. 3 depicts a cross-sectional view through X-X of a semiconductor structure for a nanosheet transistor, in accordance with an embodiment of the present invention.

FIG. 3 depicts a cross-sectional view of semiconductor structure 300 after forming a portion of a nanosheet transistor, in accordance with an embodiment of the present invention. As previously discussed, the cross-sectional view of semiconductor structure 300 is through X-X depicted in FIG. 2.

As depicted, FIG. 3 includes s substrate 2, etch stop layer 3, semiconductor 4, bottom dielectric isolation (BDI) 5, and a portion of a nanosheet transistor composed of gate 11, inner spacers 7, gate spacer 7B and ILD 9. As known to one skilled in the art, the portion of the nanosheet transistor depicted in FIG. 3 can be formed using known semiconductor processes for nanosheet device formation. While FIGS. 1-18 discuss the semiconductor manufacturing processes used for forming a nanosheet transistor, in other embodiments, other device types (e.g., memory devices such as magnetoresistive random-access memory (MRAM), phase change memory (PCM), dynamic RAM (DRAM), other types of logic devices such as finFETs, etc.) are formed with a square-shaped via or contact via between a source/drain of a semiconductor device and a backside power delivery network (BSPDN). Additionally, the processes discussed with respect to FIGS. 1-18 can be applied to other elements of a semiconductor device or other electronic device. For example, a square-shaped shallow isolation trench can be formed in a semiconductor substrate.

In various embodiments, substrate 2 is a semiconductor wafer or a portion of a semiconductor wafer and is not limited to a thinned semiconductor substrate. In various embodiments, substrate 2 is a silicon substrate. In other embodiments, substrate 2 is another type of semiconductor substrate (e.g., Ge, GaAs, etc.). Substrate 2 can be a wafer or a portion of a wafer. Substrate 2 may be doped, undoped, or contain doped or undoped regions or, may be a layered semiconductor substrate. In various embodiments, substrate 2 is a portion of a semiconductor-on-insulator (SOI) substrate composed of substrate 2, etch stop layer 3 (e.g., a buried oxide or BOX), and semiconductor 4. In another example, substrate 2 is a silicon substrate with etch stop layer 3 (e.g., silicon germanium, etc.) that is covered with a thin layer of semiconductor material that can be epitaxially grown for semiconductor 4.

In various embodiments, etch stop layer 3 is a layer of an etch stop material. For example, etch stop layer 3 can be a layer of a buried oxide (BOX) in an SOI wafer, or a layer of silicon-germanium (SiGe), or any other material used as an etch stop in semiconductor device formation.

In various embodiments, semiconductor 4 is a very thin layer of silicon. For example, semiconductor 4 can be a top portion of a silicon-on-insulator (SOI) substrate. In other examples, semiconductor 4 is a very thin layer of epitaxy (e.g., silicon). In some cases, semiconductor 4 may be epitaxially grown on etch stop layer 3, for example, when etch stop layer 3 is composed of SiGe. In some examples, semiconductor 4 is composed of another semiconductor material. The thickness of semiconductor 4 may range from 40 nm to 100 nm but is not limited to this range of thicknesses.

BDI 5 can be composed of any dielectric material used over a semiconductor material or SOI substrate to electrically isolate semiconductor 4 from the nanosheet transistor formed above it. For example, BDI 5 can be an oxide material (e.g., $SiO_2$), a nitride material, or another suitable dielectric material used in a buried isolation layer of a semiconductor device.

The portion of the nanosheet transistor can be formed with known nanosheet transistor processes and materials. For example, semiconductor layers 8 forming the device channels may be composed of silicon or another suitable semiconductor material. Inner spacers 7, and gate spacer 7B can be composed of a gate spacer material, such as SiN, SiBCN, SiOCN, SiOC, or other suitable spacer material. In some embodiments, S/D 6 can be epitaxially grown on BDI 5 above portions of semiconductor 4. In various embodiments, gate 11 is a gate structure. For example, the gate structure may include a high-k gate dielectric (not depicted), work function metals (not depicted), and conductive gate metals in gate 11. The conductive gate metal or work function metal for the gate electrode in metal gate 11 may include but is not limited to TiN, TiAl, TiC, TiAlC, TaN, Ta, Al, W, or Ru. ILD 9 can be any dielectric material used for interlayer dielectrics in nanosheet transistors or other semiconductor devices.

Figure 4:
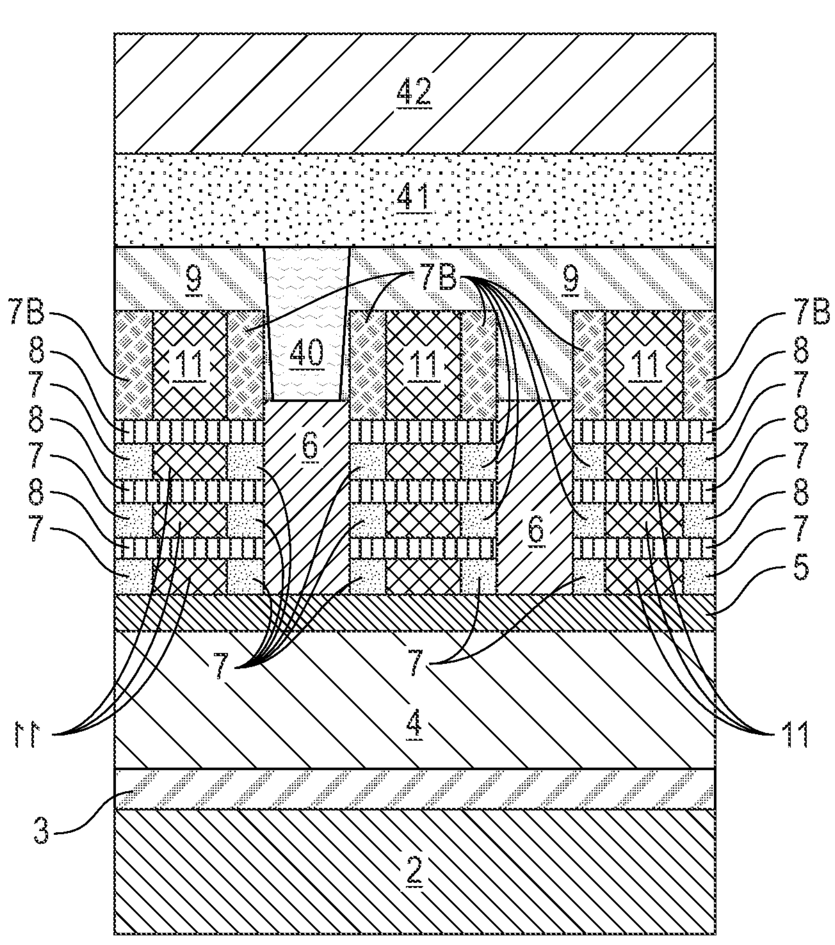
FIG. 4 depicts a cross-sectional view through X-X of the semiconductor structure of the nanosheet transistor after back end of the line formation and carrier wafer bonding, in accordance with an embodiment of the present invention.

FIG. 4 depicts a cross-sectional view 400 of the semiconductor structure after forming S/D contact 40, interconnect wiring 41, and bonding carrier wafer 42 to interconnect wiring 41, in accordance with an embodiment of the present invention. As depicted, FIG. 4 includes the elements of FIG. 3 and S/D contact 40, interconnect wiring 41, and carrier wafer 42. For example, using known middle of the line (MOL) processes, an additional layer of ILD 9 can be deposited on the top surface of the semiconductor structure before forming S/D contact 40. ILD 9 can be patterned, etched, and a layer of electrically conductive contact material deposited using known processes for contact formation. After a CMP, S/D contact 40 can be formed above S/D 6.

After forming S/D contact 40, using known processes back end of the line (BEOL) processes, interconnect wiring 41 is formed over exposed surfaces of ILD 9 and S/D contact 40. As depicted in FIG. 4, carrier wafer 42 is bonded to interconnect wiring 41 using known wafer bonding processes.

Figure 5:
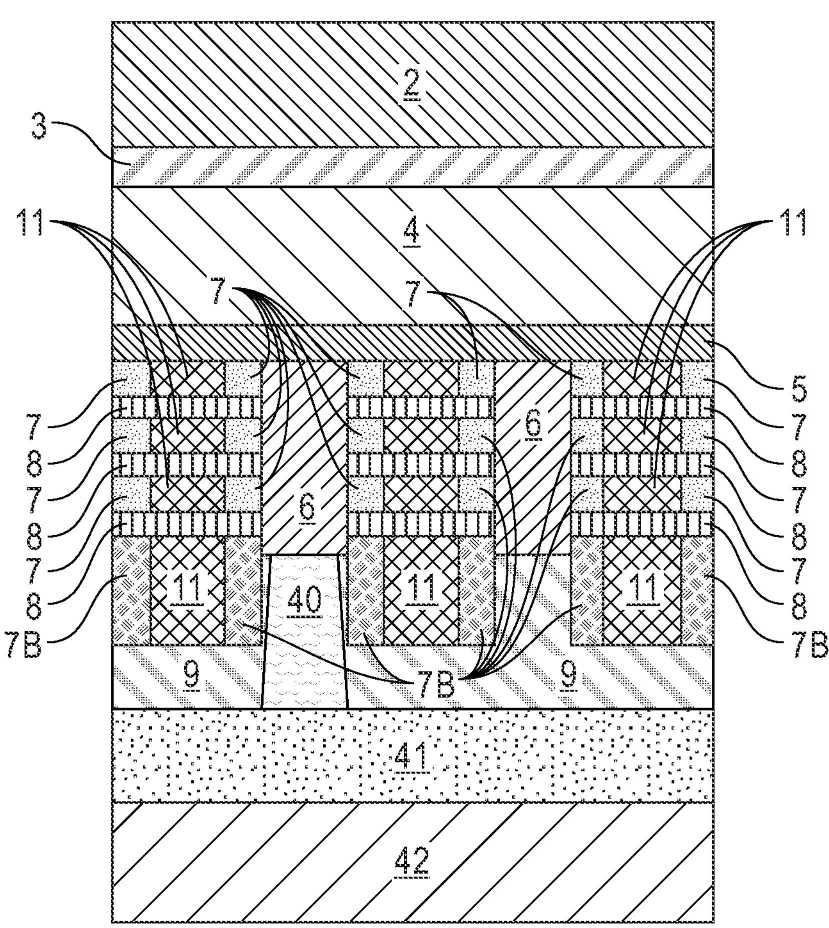
FIG. 5 depicts a cross-sectional view through X-X of the semiconductor structure after wafer flip, in accordance with an embodiment of the present invention.

FIG. 5 depicts a cross-sectional view of semiconductor structure 500 after flipping the wafer bonded to interconnect wiring 41 and S/D contact 40, in accordance with an embodiment of the present invention. As depicted, FIG. 5 includes the elements of FIG. 4 but with carrier wafer 42 and the nanosheet transistor above substrate 2 in FIG. 4 flipped (e.g., carrier wafer 42 is below substrate 2). As depicted in FIG. 5, the top surface of substrate 2 is the top surface of semiconductor structure 500 and the bottom surface of carrier wafer 42 is the bottom surface of semiconductor structure 500.

Figure 6:
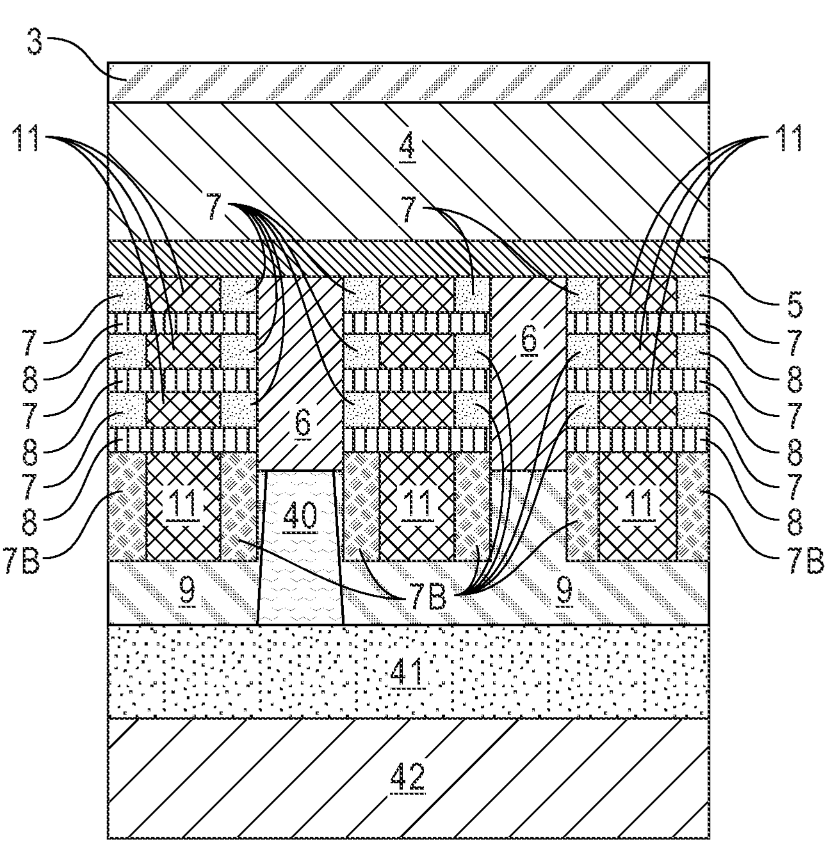
FIG. 6 depicts a cross-sectional view through X-X of the semiconductor structure after back side wafer grind, in accordance with an embodiment of the present invention.

FIG. 6 depicts a cross-sectional view of semiconductor structure 600 after substrate 2 removal by a combination of processes including backside wafer grinding, CMP, selective dry/wet etch processes that stop on the etch stop layer 3, in accordance with an embodiment of the present invention. As depicted, FIG. 6 includes the elements of FIG. 5 without substrate 2.

As depicted, substrate 2 above etch stop layer 3 is removed. For example, using known silicon grinding processes for backside wafer thinning which can be followed by CMP, and selective wet/dry etching, substrate 2 is removed above etch stop layer 3. After the removal of substrate 2, the top surface of semiconductor structure 600 is etch stop layer 3.

Figure 7:
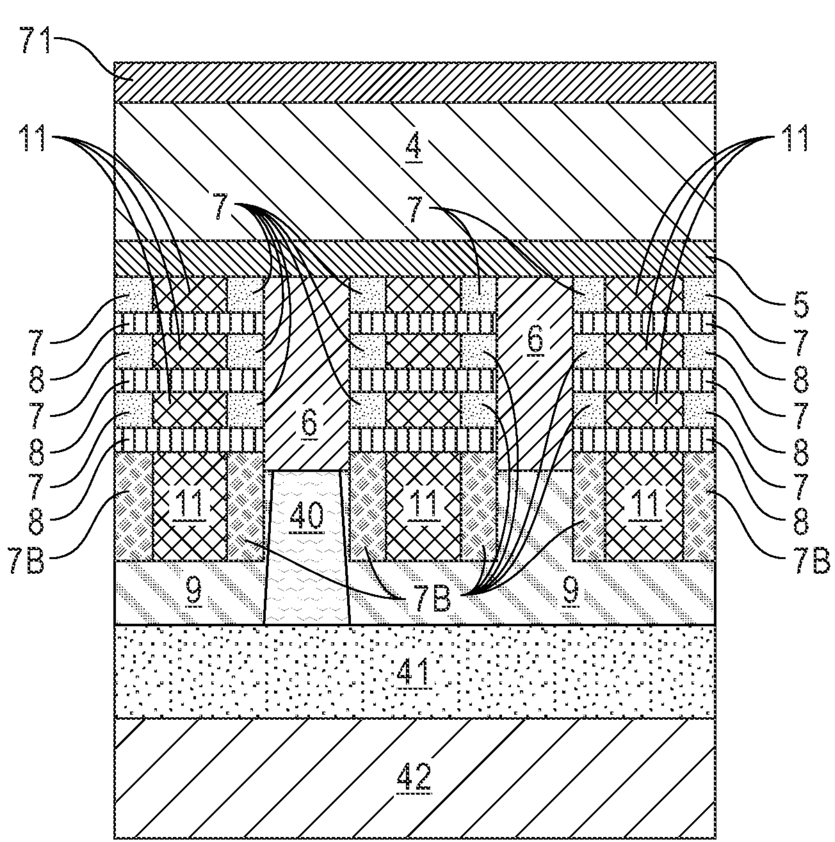
FIG. 7 depicts a cross-sectional view through X-X of the semiconductor structure after the etch stop layer removal and dielectric cap layer deposition, in accordance with an embodiment of the present invention.

FIG. 7 depicts a cross-sectional view of semiconductor structure 700 after removing etch stop layer 3 and after depositing dielectric cap 71, in accordance with an embodiment of the present invention. As depicted, FIG. 7 includes the elements of FIG. 6 without etch stop layer 3 and with a dielectric cap 71 deposited on the top surface of semiconductor 4.

For example, etch stop layer 3 above semiconductor 4 can be removed using wet etch processes. Depending on the material used for etch stop layer 3, various known wet etch chemistries may be used to remove etch stop layer 3. For example, a hydrochloric acid can be for the removal of an SiGe etch stop or conventional wet etchant for BOX removal in SOI wafers may be used to remove etch stop layer 3 when etch stop layer 3 is a BOX (e.g., composed of silicon dioxide).

Using one of the known deposition processes, such as PVD, CVD, or ALD, a layer of dielectric material can be deposited on semiconductor 4 for dielectric cap 71. For example, dielectric cap 71 may be composed of SiC, AlNx, AlOx, etc. where x is an integer such as 2. In other examples, dielectric cap 71 can be composed of another dielectric material. After removing etch stop layer 3, semiconductor 4 remains over BDI 5 and under dielectric cap 71.

Figures 8, 9:
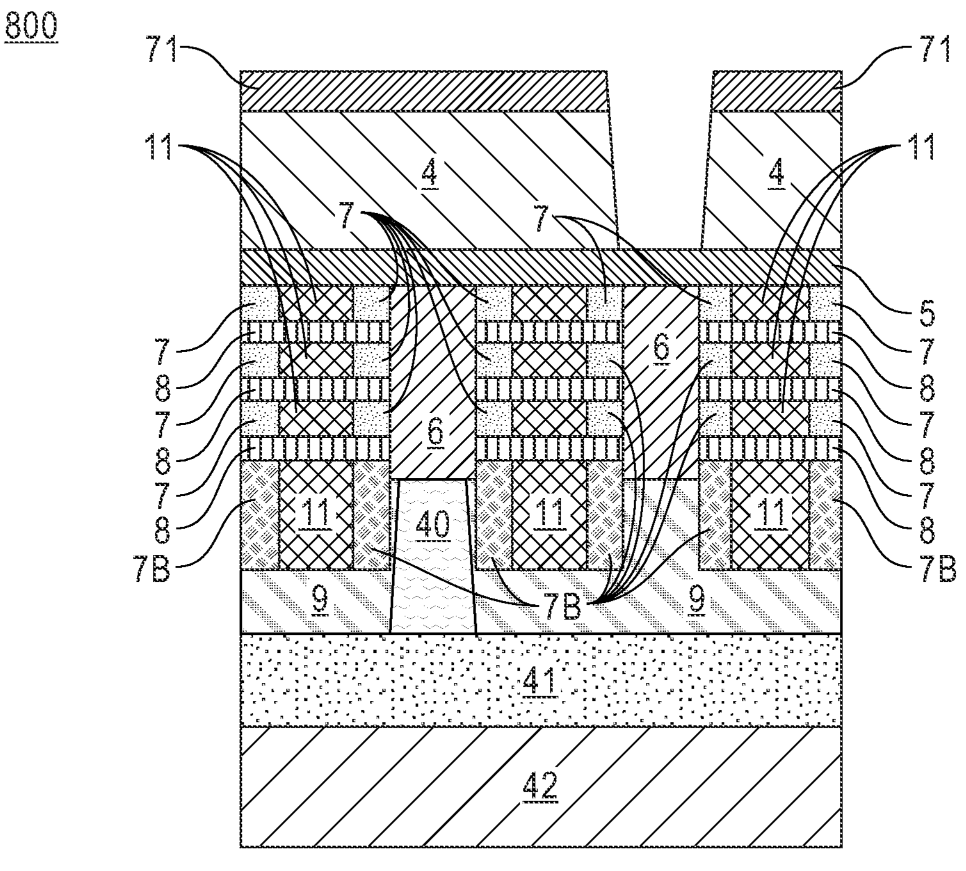
FIG. 8 depicts a cross-sectional view through X-X of the semiconductor structure after contact via etching, in accordance with an embodiment of the present invention.
FIG. 9 depicts a top view of the semiconductor structure illustrated in FIG. 8, in accordance with an embodiment of the present invention.

FIG. 8 depicts a cross-sectional view of semiconductor structure 800 after a backside contact via etch, in accordance with an embodiment of the present invention. As depicted, FIG. 8 includes the elements of FIG. 7 with a contact hole etched in dielectric cap 71 and semiconductor 4. The etching process for the contact hole formed in FIG. 8 stops on BDI 5.

Using conventional semiconductor contact via patterning and etching process, a contact via hole is etched in dielectric cap 71 and semiconductor 4 terminating on BDI 5, as depicted. For example, photolithography and a directional etching process, such as RIE are used to form the contact via hole in dielectric cap 71 and semiconductor 4. As previously discussed, using conventional contact via patterning and etching processes will result in an oval-shaped or a round-shaped contact via or hole on BDI 5 as viewed from above semiconductor structure 800. An example of the shape of the hole for the contact hole when viewed from above semiconductor structure 800 is illustrated later in FIG. 9.

FIG. 9 depicts a top view 900 of semiconductor structure 800 depicted in FIG. 8, in accordance with an embodiment of the present invention. As depicted, FIG. 9 includes the top surface of dielectric cap 71 and the view of the exposed portion of BDI 5. As depicted, the exposed portion of BDI 5 is an example of a round shape of a contact via hole after being formed with conventional patterning and an ME. While the hole or via for the contact is depicted as round, in other examples, the contact via may be oval-shaped.

FIG. 10 depicts a cross-sectional view semiconductor structure 1000 after a wet ammonia etching process forms a square-shaped contact via hole on the backside of the nanosheet transistor, in accordance with an embodiment of the present invention. As depicted, FIG. 10 includes dielectric cap 71, semiconductor 4, BDI 5, S/D 6, inner spacers 7, semiconductor layers 8, gates 11, gate spacer 7B, S/D contact 40, ILD 9, interconnect wiring 41, and carrier wafer 42.

The wet ammonia etching process removes portions of semiconductor 4 in the (100) crystal plane resulting in an undercut of semiconductor 4 in the (100) crystal plane as depicted in FIG. 10. The wet ammonia etching process does not significantly remove the portions of semiconductor 4 in the (110) crystal plane direction (not depicted in FIG. 10). Where the wet ammonia etching process selectively removes the portions of semiconductor 4 abutting the (100) crystal planes, a recess is created where portions of dielectric cap 71 can overhang the recess.

The selective removal of the portions of semiconductor 4 associated with the (100) crystal plane while the portions of semiconductor 4 associated with the (110) crystal plane are essentially unaffected or not removed creates the square-shape of the contact hole over BDI 5 on the backside of the nanosheet transistor.

FIG. 11 depicts a cross-sectional view of semiconductor structure 1100 after removing dielectric cap 71, depositing a dielectric liner 141, followed by an anisotropic etching process to remove horizontal portions of the dielectric liner 141 and a portion of BDI 5, in accordance with an embodiment of the present invention. As depicted, FIG. 11 includes the elements of FIG. 10 without dielectric cap 71, without a portion of BDI 5, and with dielectric liner 141 on the exposed vertical sides of semiconductor 4.

Using a conformal deposition process such as but not limited to ALD or PVD, dielectric liner 141 can be deposited over exposed portions of, semiconductor 4, and BDI 5. Using of known spacer deposition processes such as but not limited to ALD, PVD, or CVD, a layer of a spacer material for dielectric liner 141 is deposited over semiconductor structure 1400. For example, dielectric liner 141 may be composed of SiN, $SiO_2$, or any other spacer material used in semiconductor devices. Dielectric liner 141 acts as a liner that can prevent shorting of backside contact 160 with semiconductor 4. After liner deposition, a directional etching process (e.g., ME) removes exposed horizontal portions of contact liner 141, a portion of BDI 5. After the etching process, a portion of the top surface of S/D 6 is exposed. After forming the conventional round-shaped contact via as previously discussed and illustrated in FIGS. 8 and 9, the round-shaped contact via hole depicted in FIG. 9 was transformed to the square-shaped contact via hole using the wet ammonia etching process as previously discussed with reference to FIG. 10. As depicted in FIG. 11, the square-shaped contact hole now extends down to S/D 6.

FIG. 12 depicts a top view 1200 of semiconductor structure 1100 depicted in FIG. 11, in accordance with an embodiment of the present invention. As depicted, FIG. 12 includes the top surface of semiconductor 4 with the square-shaped contact via hole that is surrounded by contact liner 141. The square-shaped contact via hole exposes a portion of S/D 6. The square-shaped hole outlined by contact liner 141 can be a rectangular-shaped hole in other examples. As known to one skilled in the art, the number of contact via holes formed is not limited to one but can be any number of contact via holes, any number of via holes, or other type of square hole in a semiconductor substrate of any type of electronic device.

Figure 13:
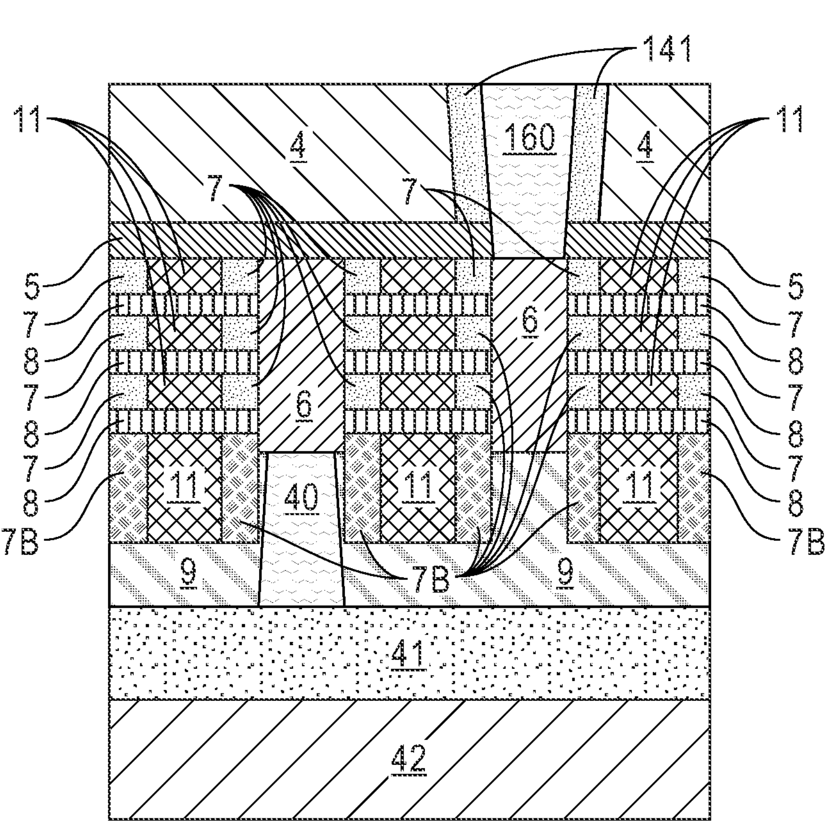
FIG. 13 depicts a cross-sectional view through X-X of the semiconductor structure after forming a S/D contact, in accordance with an embodiment of the present invention.

FIG. 13 depicts a cross-sectional view of semiconductor structure 1300 after forming contact 160 with S/D 6, in accordance with an embodiment of the present invention. As depicted, FIG. 13 includes the elements of FIG. 11 and contact 160. Contact 160 contacts S/D 6 where S/D 6 as depicted in FIGS. 2 and 3 is formed on etch stop layer 3 on substrate 2 in the backside portion of the nanosheet transistor depicted previously in FIGS. 2 and 3.

As depicted, contact 160 formed on the backside of the nanosheet transistor. Contact 160 can be formed using known deposition processes, such as PVD, ALD, CVD, etc., to deposit a layer of a contact material such as but not limited to metal materials including a silicide liner (not depicted), such as Ti, Ni. NiPt, a metal adhesion liner, such as TiN, and conductive metal fill, such as cobalt, copper, ruthenium, or tungsten is deposited over semiconductor structure 1300. A CMP was performed to remove excess contact material from the top surface of semiconductor 4 to complete the formation of backside contact 160 on S/D 6 as depicted in FIG. 13.

As previously discussed, the square contact via hole depicted in FIG. 12 exposes a square portion of the surface of S/D 6. The exposed portion of S/D 6 is covered by contact 160 which has a square or rectangular shape. As depicted in FIG. 14, contact liner 141 covers the sides of the top portion (e.g., above BDI 5) of contact 160.

FIG. 14 depicts a cross-sectional view of semiconductor structure 1400 after recessing the top surface of semiconductor 4, in accordance with an embodiment of the present invention. As depicted, FIG. 14 includes the elements of FIG. 13 without the top portion of semiconductor 4. Using known wet or dry etching (e.g., RIE), the top portion of semiconductor 4 is removed around contact liner 141. For example, 2 and contact liner 141. Using of known spacer deposition processes such as but not limited to ALD, PVD, or CVD, a layer of a spacer material for contact liner 141 is deposited over semiconductor structure 1400. For example, contact liner 141 may be composed of SiN, $SiO_2$, or any other spacer material used in semiconductor devices. Contact liner 141 acts as a liner that can prevent shorting of backside contact 160 with high k metal gate 11.

FIG. 15 depicts a cross-sectional view of semiconductor structure 1500 after depositing dielectric cap 81, in accordance with an embodiment of the present invention. As depicted, FIG. 15 includes the elements of FIG. 14 and dielectric cap 81.

Using one of the known semiconductor deposition processes, such as PVD or ALD, a layer of dielectric material can be deposited on semiconductor 4 for dielectric cap 81. For example, dielectric cap 81 may be composed of SiC, AlNx, AlOx, etc. where x is an integer such as 2. In other examples, dielectric cap 81 can be composed of another dielectric material. Dielectric cap 81 can provide protection to semiconductor 4 (e.g., can perform hardmask-like protection). In various embodiments, dielectric cap 81 acts as an etch stop for backside power rail etch in later process steps.

FIG. 16 depicts a cross-sectional view of semiconductor structure 1600 after forming backside power rail 180 and a backside power delivery network (BSPDN) 181, in accordance with an embodiment of the present invention. As depicted, FIG. 16 includes the elements of FIG. 15 with backside power rail 180, via 80, and backside power delivery network (BSPDN) 181.

Using known backside power rail formation processes, a layer of a conductive material or metal, such as but not limited to copper or another power rail material is deposited on the exposed top surfaces of dielectric cap 81, contact liner 141, and contact 160. As depicted, a layer of dielectric material for ILD 91 is deposited over backside power rail 180 followed by known via patterning processes, a via etch process, and via material deposition (e.g., copper, W, etc.). As depicted in FIG. 16, BSPDN 181 is connects to and is above contact 160. A CMP removes excess via material to form via 80 in ILD 91. Using conventional backend of the line (BEOL) processes, BSPDN 181 can be formed on via 80 and ILD 91.

Semiconductor structure 1600 illustrates a semiconductor device, such as a nanosheet transistor on interconnect wiring 41 above carrier wafer 42. Contact 160 in semiconductor 4 is formed from a conventional round contact via hole by adding a wet etching process with an ammonia-containing etchant. The wet ammonia etching process rapidly etches the portions of semiconductor 4 in the direction of the (100) crystal planes while providing a slow, self-limiting etch of semiconductor 4 in the direction of the (110) crystal planes. The different etch rates in the direction of different crystal planes in semiconductor 4 results in changing a round hole into a square-shaped contact via hole. As depicted, contact 160, with a square shape, connects to S/D 6 on the backside of the nanosheet transistor.

As known to one skilled in the art, one or more of contact 160 can be under a semiconductor device element on the backside or above (i.e. on) the frontside of the nanosheet transistor or in other types of devices (e.g., memory devices, photovoltaic cells, etc.) where the semiconductor device element can be a source/drain, a backside power rail, a power rail (e.g., below the semiconductor device), a pad in the BEOL interconnect wiring, a gate structure, a line, another contact, a p-junction, photo-junction, another via, or any element in a semiconductor device or other type of electronic device. The contact area of contact 160 to S/D 6 is a square-shape that provides a larger contact area to S/D 6 than the contact area provided by a conventional round-shaped backside contact via with a diameter that is the same as the width of the square-shaped contact 160. Therefore, the square shape of contact 160 can improve the electrical performance of the semiconductor device and the completed semiconductor chips that include one or more of contact 160 with the square-shape. In one embodiment, contact 160 connects to BSPDN 181. For example, power rail 180, ILD 91, and via 80 are not present and contact 160 connects to a pad (not depicted) in interconnect wiring 181.

Additionally, by having semiconductor 4 with dielectric cap 81 between the semiconductor device (e.g., nanosheet transistor with channels in semiconductor layers 8) and backside power rail 180, it provides a good thermal path for better dissipation of the heat or thermal energy generated by the transistor to backside power rail 180 than a conventional dielectric material or ILD. In conventional semiconductor structures for semiconductor devices above a carrier wafer and under a backside power rail, the thermal energy of the semiconductor device (e.g., nanosheet transistor) must dissipate through the less thermally conductive dielectric material that is typically between the semiconductor devices and the backside power rail.

FIG. 17 depicts view 1700 from the backside of the nanosheet transistor of semiconductor structure 1600 with contact 160 and contact liner 141, in accordance with an embodiment of the present invention. As depicted, FIG. 17 includes gates 11, gate spacer 7B, S/D 6, contact liner 141, and contact 160 looking from the backside of the nanosheet transistor.

As depicted, contact 160 with the square or rectangular shape is surrounded an all four sides by contact liner 141. Contact liner 141 connects with a square portion of the top surface of one of S/D 6 that is covered by contact 160. As previously discussed, the area of the square portion of the top surface of one of S/D 6 that is covered by contact 160 is greater than the round area covered by a conventional round contact with the same diameter as the width of the square area covered by contact 160.

The methods, as described herein, can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A semiconductor structure comprising:

a rectangular-shaped via in a semiconductor material, wherein:

the rectangular-shaped via directly contacts: (i) a source/drain and (ii) a power rail;

the rectangular-shaped via has a total of six sides;

the rectangular-shaped via tapers such that a first surface contacting the source/drain has a smaller surface area than a second surface contacting the power rail; and the first surface is planar; and a dielectric liner surrounding tapered sides of the rectangular-shaped via, wherein a surface of the dielectric liner directly contacts the power rail and the surface of the dielectric liner is coplanar with the second surface.

2. The semiconductor structure of claim 1, wherein the rectangular-shaped via contacts a rectangular-shaped portion of the source/drain and a rectangular-shaped portion of the power rail.

3. The semiconductor structure of claim 1, wherein the power rail is a backside power rail.

4. The semiconductor structure of claim 2, wherein the source/drain is on a selection from the group consisting of: a backside of a semiconductor device and a frontside of the semiconductor device.

5. A semiconductor structure comprising:

a square-shaped contact via in a semiconductor material of a semiconductor device, wherein the square-shaped contact via has a total of six sides;

a first semiconductor device element under the square-shaped contact via; and a second semiconductor device element above the square-shaped contact via, wherein:

the square-shaped contact via tapers such that a first surface contacting the first semiconductor device element has a smaller surface area than a second surface contacting the second semiconductor device element; and the first surface is planar.

6. The semiconductor structure of claim 5, wherein the square-shaped contact via in the semiconductor material has straight edges that are parallel to one or more (110) crystal planes of the semiconductor material.

7. The semiconductor structure of claim 5, wherein the square-shaped contact via in the semiconductor material has corners pointing in a direction orthogonal to one or more of (100) crystal planes of the semiconductor material.

8. The semiconductor structure of claim 5, wherein the first semiconductor device element is a source/drain of the semiconductor device.

9. The semiconductor structure of claim 5, wherein the second semiconductor device element is a pad in an interconnect wiring layer.

10. The semiconductor structure of claim 5, wherein the semiconductor device is selected from the group consisting of: a logic device, a memory device, and a photovoltaic device.

11. The semiconductor structure of claim 5, wherein the semiconductor device is a nanosheet transistor.

12. The semiconductor structure of claim 8, wherein the source/drain is on a backside of a nanosheet transistor.

13. The semiconductor structure of claim 12, wherein the source/drain is on a backside of the nanosheet transistor and connects to a backside power rail by the square-shaped contact via, further comprising:

a dielectric layer with at least one via over the backside power rail; and a back end of line interconnect wiring layer connecting, by the at least one via, to the backside power rail.

14. A method comprising:

patterning a top surface of a first layer of dielectric material on a semiconductor material for a first contact via hole;

etching the first contact via hole through the first layer of dielectric material and through a semiconductor layer, wherein the first contact via hole has a round shape;

performing a wet ammonia etching process on the first contact via hole to form a second contact via hole in the semiconductor material, wherein the second contact via hole has a rectangular shape;

removing the first layer of dielectric material on the semiconductor material;

depositing a layer of a contact material over the semiconductor material and in the second contact via hole; and depositing and planarizing a contact metal to form a rectangular-shaped contact via, wherein:

the rectangular-shaped contact via has a total of six sides;

the rectangular-shaped contact via tapers such that a first surface contacting the semiconductor material has a smaller surface area than a second surface;

the first surface is planar; and the second surface is a surface of the contact metal exposed as a result of planarizing the contact metal.

15. The method of claim 14, wherein the semiconductor material is a silicon material.

16. The method of claim 14, wherein performing the wet ammonia etching process on the first contact via hole to form the second contact via hole in the semiconductor material further comprises:

a minimal etching of the semiconductor material in a direction of one or more (110) crystal planes of the semiconductor material; and a rapid etching of the semiconductor material in the direction of one or more (100) crystal planes of the semiconductor material.

17. The method of claim 14, wherein removing the first layer of dielectric material on the semiconductor material, further comprises removing an exposed portion of a second dielectric material below the second contact via hole, wherein removing the exposed portion of the second dielectric material occurs on a portion of a source/drain on a backside of a nanosheet transistor.

* * * * *